Figure 1:
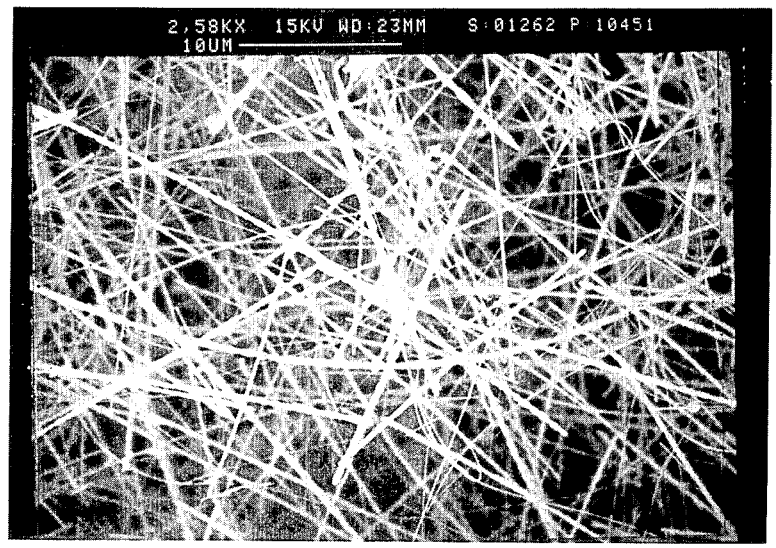

United States Patent [19]

Dubots et al.

[11] Patent Number: 4,904,622
[45] Date of Patent: Feb. 27, 1990

[54] PROCESS FOR THE PREPARATION OF SILICON CARBIDE WHISKERS

[75] Inventors: Dominique Dubots, Le Fayet; Francis Dubrous, Sallanches, both of France

[73] Assignee: Pechiney Electrometallurgie, Courbevoie, France

[21] Appl. No.: 157,619

[22] Filed: Feb. 19, 1988

[30] Foreign Application Priority Data

Feb. 23, 1987 [FR] France ............... 87 02528

[51] Int. Cl.$^4$ .................................. C04B 35/56
[52] U.S. Cl. ........................ 501/88; 501/95; 423/345
[58] Field of Search ............ 501/88, 95; 423/345

[56] References Cited

U.S. PATENT DOCUMENTS 4,500,504  2/1985  Yamamoto ................ 501/88
4,690,811  9/1987  Kida et al. ............... 423/345

FOREIGN PATENT DOCUMENTS 2567873  1/1986  France .
2573444  5/1986  France .
2162504  2/1986  United Kingdom .

Primary Examiner—Mark L. Bell
Assistant Examiner—Anthony J. Green
Attorney, Agent, or Firm—Dennison, Meserole, Pollack & Scheiner

[57] ABSTRACT

The invention relates to a process for the preparation of silicon carbide whiskers by the reaction, in a non-oxidizing atmosphere, at a temperature of at least 1300° C., of a charge composed of a mixture of carbon black and a source of silicon oxide, in which process the carbon black has an oxidability rate (measured by heating in air for 30 minutes at 600° C.) of at least 85%, the silicon oxide source has a grain size of less than 100 μm and the rate of rise in temperature between 1300° and 1600° C. is less than 30° C.min$^{-1}$ per minute if a static atmosphere prevails and at most 25° C.min$^{-1}$ if gas percolated. A stage of from 5 min to 5 h at 1600° C. is optionally carried out.

The carbon is preferably introduced into the reaction mixture in an over-stoichiometric quantity relative to the silica.

The excess carbon is removed at the end of the reaction by oxidation in air at about 600° C.

10 Claims, 1 Drawing Sheet

PROCESS FOR THE PREPARATION OF SILICON CARBIDE WHISKERS

TECHNICAL FIELD OF THE INVENTION

The present invention relates to a process for the preparation of silicon carbide whiskers from silica and carbon in the finely divided state.

STATE OF THE ART

Whiskers are fine monocrystalline fibres of silicon carbide, the diameter of which can range from 0.1 to 5 micrometers depending on the operating conditions and the length of which can range from several tens to several hundreds of micrometers, the colour varying from colourless to pale green. They are characterised by noteworthy mechanical properties (ultimate tensile stress from 4 to 12 GPa/modulus of elasticity from 300 to 700 GPa), high chemical stability and high resistance to heat, producing a material which is suitable for reinforcing metallic or plastic materials, for example aluminium and alloys thereof.

The preparation of whiskers entails the reaction of silicon, in the form of silica, and of carbon in finely divided form. This type of reaction is greatly dependent on factors such as the source of silicon, the nature of the carbon, the mixing procedures, the possible additives (catalysts and/or foaming agents), the atmosphere and the temperature at each point of the reaction charge.

French patent application FR-A-2 573 444 (TOKAI CARBON Co Ltd) describes a process for the production of SiC whiskers involving heating a mixture of carbon black and a source of silicon (sand, silex, silica gel, etc.) in a non-oxidising atmosphere at a temperature of from 1300° to 1800° C. The carbon used should have a specific surface area for absorption of nitrogen of from 150 to 500 $m^2/g$, a DBP (dibutylphthalate) absorption rate of from 120 to 200 ml per 100 g and a predetermined colour intensity. The catalyst is based on iron, nickel or cobalt.

In French patent application FR-A-2 567 873 (Nippon Light Metal Co Ltd), a process for obtaining SiC whiskers from powdered carbon and powdered $SiO_2$ is also described, the mixture having a bulk density not exceeding 0.23, the mixture being heated in an inert gas atmosphere to between 1500° and 2000° C. in this process.

These processes are still in the experimental state. To produce SiC whiskers of which the structure, characteristics and cost price are suitable for industrial use, it is necessary to provide a process capable of producing these whiskers with the minimum of morphological reliefs such as aggregates, with lengths of the order of from 5 to 200 μm, and diameters of less than 5 μm, and with a high yield of whiskers relative to the charge of $SiO_2+C$.

SUBJECT OF THE INVENTION

The invention relates to a process for the production of SiC whiskers from carbon black and finely divided silica, by heating in a non-oxidising atmosphere at a temperature of between 1300° and 1800° C. and preferably between 1300° and 1600° C.

This process is characterised in that the carbon black used should have an oxidability rate of at least 85%, the oxidability being defined by the loss in the weight of the carbon under consideration when it is heated to 600° C. for 30 minutes in the open air.

This process is also characterised in that the velocity at which the temperature of the reaction mixture rises should be at most 10° C./min$^{-1}$ and preferably less than 3° C./min$^{-1}$ if a static atmosphere prevails. If nitrogen percolation, defined by a flow rate of between 0.05 and 0.5 normolitre per minute and per $cm^2$ of traversed charge, is effected, the rate of the rise in temperature of said charge should be at most 25° C./min$^{-1}$.

It is advantageous to add to the carbon black/silica mixture a foaming agent which maintains the gas permeability of the charge. The hollow spaces thus created allow ventilation of the charge by reactive gas species required for the growth of the whiskers in these volumes not occupied by solids.

Similarly, to facilitate homogeneous transfer of the gaseous products containing the reactive species (essentially silicon monoxide and carbon monoxide), the concentrations of which should be suitable for the temperature according to thermodynamics, it is worth percolating a gas such as nitrogen through the charge during the reaction (or, in the absence of percolation, low velocity sweeping or scavenging with a gas would be favourable).

Figure 2:

FIGS. 1 and 2 are photographs of reaction products taken by scanning electron microscopy. FIG. 1 (magnification 3000) shows a cocoon of very high quality whiskers. FIG. 2 (magnification 1500), on the other hand, shows the result of tests outside the limits of the invention. Numerous aggregates and morphological reliefs are seen on the fibres obtained.

The conditions for carrying out the process can be separated into three sections: preparation of the silica/carbon mixture, any additives, the reaction as such and obtaining of the whiskers.

1. Preparation of the Mixture

The first characteristic of the process is that the reactants (silica and carbon) have to be dry blended, and the resultant mixture must not be packed. One way of fulfilling this condition involves using a turbulent mixer equipped with lump-breaking knives, which has the characteristic of not packing the mixture. The bulk density of the mixture therefore depends on the raw materials and can be as much as 0.40.

Choice of Raw Materials

Silica:

Silicas of various origins have been used: ultrafine silicas collected when removing dust from electro-metallurgical furnaces producing silicon or ferro-silicon, or from electric zircon sand fusing furnaces (zirconium silicate). This dust contains at least 85% of $SiO_2$ in the form of beads having a diameter of less than 1 μm. The impurities are formed by volatile organic materials, carbon, silicon carbide and Fe, Al, Mg, Ca, Na, K compounds. Precipitated silica, crushed quartz or sand, crushed white glass may also be suitable. All these qualities of silica are suitable providing that they are sifted through a sieve having a mesh of at most 100μum.

Carbon:

The nature of the carbon is an essential factor for carrying out the invention. Generally speaking, the products used should belong to the class of products known as "carbon blacks" obtained either by incomplete combustion or by thermal dissociation of hydrocarbonated combinations. In practice, these hydrocarbonated combinations are natural gas, acetylene, mineral oils or tar oils. These products are characterised in particular:

by a particle size of the order of from 5 to 50 nanometres, by a carbon content of the order of from 95 to 99%, the remainder being hydrogen, oxygen, nitrogen or sulphur, by a very high BET specific surface area of the order of from 10 to 1000 m$^2$ per gramme,.

by DBP (dibutylphthalate) adsorption of the order of from 50 to 200 ml/100 g, by a nigrometric index (depth of blackness) measured by adsorption of absorbed and reflected light.

The manufacturers of these various types of blacks (furnace black, acetylene black, gas black, etc.) also mention other particular characteristics, according to the envisaged use (pigments for inks and paints, charge for rubber or plastic) which are of no interest in the present case.

However, the applicants have found that the essential factor, which does not appear in the specifications produced by carbon black manufacturers, was the reactivity of the product and, more specifically, its oxidability, which has been defined above.

The embodiments to be given hereinafter will confirm the essential character of this carbon black selection test.

Catalysts and Additives:

As the carbon is selected on the basis of its reactivity, it is not necessary to introduce conventional catalysts (Fe, Ni, Co) in order to carry out the invention. However the fortuitous presence of these metals and of alkaline metal compounds has a rather favourable effect, in particular the sodium compounds which, moreover, have an effect on the oxidability rate of the carbon black by assisting the formation of compounds which are more reactive.

The introduction of a foaming agent allows the yield and effectiveness of the reaction to be improved very substantially. It is introduced into the C+SiO$_2$ mixture in a proportion which can range from 5 to 50% by volume. This agent escapes in gaseous and/or vapour form just before or during the start of the reaction and it thus promotes the formation of a very porous mass of tangled whiskers (cocoon) allowing a reaction mass of high porosity, which is distributed homogeneously and thus affords a slighter loss of charge for the gases and few preferential paths for the dilute reactive gas species to be obtained from it. The homogeneous ventilation of the solids in the reaction mass by this gas supply allows homogeneous growth of the whiskers in the pores of this solid mass.

From among the foaming agents tested, the applicants have found that mineral compounds (of the NaCl, NH$_4$Cl type) were not very favourable because they seem to wet or impregnate the reactants and to induce parasitic reactions which are manifested by deformed whiskers and by the formation of grains and aggregates.

On the other hand, the organic compounds which generate only a few tars of the wood dust, cork, starch, melamine, or rice ball type appear to be very favourable. Two types of foaming agents which meet the constraints of the process should be distinguished:

those which sublime or decompose completely without leaving residues, for example melamine, those which leave residues such as ash or coke and for which the granule size should be selected such that these impurity-containing residues can be eliminated by conventional methods such as oxidation at low temperature, flotation, suspension sifting and decantation.

2. Implementation of the Reaction

The reaction is carried out on a mixture of SiO$_2$ which all passes through a 100 μm seive, of reactive carbon black and optionally from 5 to 50% by volume of foaming agent.

The carbon black is preferably introduced in an above-stoichiometric quantity: at least 70 parts by weight of carbon black per 100 parts by weight of silica (ratio 0.7). If the overall reaction is:

$$SiO_2 + 3C \rightarrow SiC + 2CO$$

60 g of carbon black (based on 100% by weight of carbon) are required for 100 g of silica (based on 100% by weight of SiO$_2$), that is a ratio of 0.6. The possible presence of carbon reducible oxidised impurities also has to be taken into consideration in the calculation, for example Na$_2$O if the source of SiO$_2$ is a crushed glass.

Although the over-stoichiometry of carbon black is economically unfavourable, it promotes the subsequent dispersion of the whiskers forming the cocoon.

The intimate mixture of carbon black +SiO$_2$ plus possible foaming agent must not be packed as mentioned above. Its apparent density may be, for example, between slightly less than 0.20 and 0.40 grams per cm$^3$, depending on the source of silica used (quality and granule distribution), the black and the possible additives.

Heating

The applicants have found—and this is another essential element of the invention—that one of the fundamental factors in the synthesis of whiskers is the rate at which the temperature rises which actually controls the subtle kinetics of gaseous growth of the monocrystals of SiC$\beta$ along a preferred axis.

The reaction commences at between 1300° and 1400° C. and the most important aspect of the invention precisely involves continuously controlling the temperature imposed on the reaction mass so as never to get ahead of the consumption of the gaseous reagents by the process of crystalline growth of the whiskers while maintaining a temperature gradient in the mass.

The applicants have also observed the importance of the factors of volume of mixture and position of the heat flows relative to the surfaces of the volume constituted by the reaction mass. It has also been found that a heat flow originating from the exterior of the charge is favourable to the formation of whiskers.

The reaction products are thermal insulators, such that the first layers of transformed reactants reduce the rate of passage of the flow of heat while acting as a heat screen. This effect therefore slows down the rate at which the temperature of the reaction mass rises, and this is a factor which is favourable to the formation of SiC in the form of whiskers. A rapid rise is therefore manifested by the formation of an external screen layer, the thickness of which is a function of this rate of rise in temperature and is constituted essentially by particles which do not have the morphology of the whiskers. The thickness of this layer can significantly reduce the effectiveness of the operation with regard to the yield (quantity of whiskers formed).

When the maximum temperature of the charge has been attained —that is 1800°, but generally about 1600° C.—the heating can be switched off and the reaction mass can be left to cool, insofar as small volumes and a very reactive silica having fine granules has been used. If this is not the case, that is to say if the reaction mass weighs from several hundreds of grammes to several kg or tens of kg, and/or a less reactive silica is used (crushed glass for example), a stage at the maximum temperature (about 1600° C. for example) is carried out for a duration of from 5 minutes to 5 hours, then the heating is switched off and the charge is left to cool. If the process has been carried out with percolation of nitrogen, a nitrogen stream, which may be reduced, is maintained for at least a proportion of the cooling time.

Once the reaction mass has been heat treated, the silicon carbide whiskers form a cocoon, the porosity and the mechanical strength of which depend on the bulk density of the reaction mixture, more precisely on its degree of packing or of compaction and on the proportion of carbon black.

If this mass is developed over the entire external surface of the reaction volume and progresses towards the interior, a proportion of the reaction mixture is enclosed by a thick casing of tangled whiskers. The reaction for forming silicon carbide from silica and carbon generates significant quantities of a gas species: carbon monoxide. It is necessary to eliminate this gas without excessive losses of charge in order to maintain a low internal pressure. This condition has not been met in the core of the cocoon owing to the respective position of the heat flows and of the reaction mass or the absence (or insufficiency) of foaming agent.

The applicants have found that, in this case, it is easy to eliminate this cocoon core because it has a different cOnsistency and colour from the thick layer of tangled whiskers enclosing it.

The applicants have also found that this phenomenon could be reduced by percolating a gas such as nitrogen which seems to assist the growth of whiskers, probably by allowing the transitory formation of intermediate nitrogen-containing compounds.

When the respective positions of the source of heat and of the reaction mass have been modified by using susceptors or resistors placed in the centre or in the axis of the charge, it is not possible to obtain the normal quantity of whiskers in the form of a cocoon. It would seem that the whiskers grow in a hot region from gas species which are generated in a cooler region, that is to say from gas species in proportions (or partial pressures) not corresponding to the proportions for thermodynamic equilibrium calculated in the hot region of whisker growth.

3. Separation of the Whiskers

Separation of the whiskers of the cocoon formed constitutes the last stage of the process forming the subject of the present invention. The reaction product is obtained in the form of a cocoon formed by two easily separated regions:

an external casing, the thickness of which varies according to the operating conditions and which is constituted almost exclusively by silicon carbide whiskers and excess carbon black, a central portion without high mechanical strength which is formed almost exclusively by a powder containing silicon carbide particles, excess carbon black and some whiskers.

It is known that this carbon black can be eliminated by heating in air at between 500° and 700° C.

EMBODIMENTS

The invention has been carried out in a horizontal electric furnace comprising a tubular graphite resistor and having an internal diameter of 200 mm, which is scavenged with nitrogen (3 litres per minute). The reaction charge is placed in a graphite crucible which is perforated with vents, has an internal diameter of 120 mm and a length of 500 mm, is filled to a maximum of ⅔ by the reaction mixture and is arranged in the region of the furnace at uniform temperature.

Example 1

The starting mixture is composed of:

48% by weight of FW2V carbon produced by the Company DEGUSSA, having a BET surface area of 460 $m^2g^{-1}$, an oxidation rate of 87% and a volatile substance index of 16% by weight, 52% by weight of micrometric silica collected during removal of dust from silicon furnaces: 52% (by weight). Density of the mixture: 0.20 g/cm³, Conditions: rise from ambient temperature to 1000° C. in 2 h (500° $C.h^{-1}$). Rise from 1000° to 1300° C. in 3 h (100° $C.h^{-1}$), and from 1300° to 1600° C. in 8 h (50° $C.h^{-1}$, that is <1°.$min^{-1}$). Natural cooling with nitrogen scavenging.

The cocoon, which is cut in two along its axis, is removed from the crucible. The residual carbon is then oxidised by heating in air to 600° C. for a period which depends on the oxidability of the carbon black used. The various regions of the cocoon are then separated as a function of their colour and their mechanical consistency.

In the first example, a very attractive cocoon of whiskers is obtained, with fibres having a diameter of less than 5 micrometers, an average length of from 20 to 100 μm and a very small proportion of morphologically undesirable species, identical to those in FIG. 1.

Example 2

The same conditions as in Example 1 were adopted, but the micrometric silica was replaced by crushed and sifted white glass, which passed through a 100 μm sieve and had a total content of Na+K of about 15% and 0.6 of $Fe_2O_3$ originating from the crushing operation and less than 5% (by weight) of boron (in the compound state).

The mixture is made up in the following proportions:
crushed white glass: 58% by weight
carbon black: 42% by weight
density of the mixture: 0.33 g.$cm^{-3}$ Some FW2V carbon black produced by DEGUSSA, as in Example 1, and some Printex 85 produced by DEGUSSA and having a BET surface area of 200 $m^2.g^{-}$and an oxidability rate of 87% by weight (30 min/600° C.) were used in this series of tests, with virtually identical results. This formulation also gives very attractive cocoons with fibres having a diameter of less than 5 μm and a length of from 20 to 100 μm (identical to those in FIG. 1).

Example 3

The same conditions as in Examples 1 and 2.
The mixture contains:
micrometric silica dust (from Si furnace): 29%
Printex 85: 21%
melamine (foaming agent): 50%
bulk density: 0.4 g.$cm^{-3}$ Result: very good, as in Examples 1 and 2.

Example 4

The same conditions as in Example 1, but the rate at which the temperature rises was fixed at 20° C./min between 1300° and 1500° C., and nitrogen was percolated through the charge at a flow rate of 0.15 normolitre/min and per cm$^2$ of furnace cross section, a temperature modifying stage of 2 hours being carried out at 1600° C.

A cocoon of very attractive whiskers is obtained, whereas the same test only produced thick short rods of SiC mixed with aggregates of SiC crystals which were useless for the production of composite materials having metallic matrices when carried out without nitrogen percolation.

Example 5

The same conditions as in Example 1, but the mixture was homogenised in ethyl alcohol. Bulk density: 0.7 g.cm$^{-3}$ after evaporation of the alcohol.

Result: The final product is useless. Only a few whiskers coated in an aggregate of SiC grains is obtained.

Example 6

The same conditions as in Example 1, but the carbon black has an oxidability rate of 70% (30 min/600° C./air).

Result: Cocoon of whiskers mixed with morphologically undesirable products which can be separated but which greatly reduce the yield of useful product (Photo No.2).

Example 7

The same conditions as in Example 1, but the carbon black has an oxidability rate of 15%.

Result: Only a few whiskers of SiC dispersed in an aggregate, from which it is difficult to extract them, are obtained.

Example 8

The same conditions as in Example 1, but the rate of rise in temperature has been modified. The temperature is raised from 1000° to 1600° C. in intervals of 100° C. while making stages of from 30 to 60 mm and applying rates of rise in temperature of 10° C./min between each stage in a first test, 20° C./min in a second test, 30° C./Min in a third test. These three tests were carried out without percolation of nitrogen.

The results were mediocre in all three cases: heterogeneous whiskers (in length and diameter), large proportion of grains and of aggregates.

It is therefore confirmed that the claimed conditions constitute limits, outside which satisfactory results are not obtained.

We claim:

1. A process for the preparation of silicon carbide whiskers by reaction in a nitrogen atmosphere at a temperature of at least 1300° C. of a charge comprising a mixture of carbon black and a source of silicon oxide, comprising the steps of:
   (1) dry mixing, without packing and without addition of catalyst,
      (a) carbon black, having an oxidability rate, measured by heating in air at 600° C. for 30 minutes, of at least 85%, and
      (b) a source of silicon oxide having a grain size of less than 100 μm,
      in a ratio by weight of carbon to silicon oxide at least equal to the amount necessary for the stoichiometric reaction of the silicon to form silicon carbide, wherein said mixture has a density of about 0.2 to 0.4 grams per cm$^3$, and
   (2) heating said dry mixture to about 1600° C. wherein the rate of rise in temperature at between 1300° and 1600° C. is at most 10° C. min$^{-1}$ under a static atmosphere or at most 25° C. min$^{-1}$ under gas percolation.

2. A process according to claim 1, wherein said source of silicon oxide is SiO$_2$, and the weight ratio C/SiO$_2$ is at least 0.6.

3. A process according to claim 2, wherein the ratio by weight of C/SiO$_2$ is at least 0.7.

4. A process according to claim 1, 2 or 3, wherein that a temperature stage at about 1600° C. is carried out for a period of between 5 minutes and 5 hours.

5. A process according to claim 1, 2 or 3, wherein the mixture also contains an organic foaming agent.

6. A process according to claim 1, 2 or 3, wherein the heating takes place under nitrogen percolation at a rate of between 0.05 and 0.5 normolitre per minute and per cm$^2$ of cross-section of the mixture.

7. A process according to claim 1, 2 or 3, wherein the source of silicon oxide comprises silica dust collected during removal of dust from furnaces for the carbothermic production of silicon or ferro-silicon or from electric, zircon said fusion furnaces, said dust containing at least 85% of silica in the form of beads having an average diameter of less than 1 micron.

8. A process according to claims 1, 2 or 3, wherein the source of silicon oxide comprises a glass frit, the particle size of which is less than 100 μm, which contains more than 10% by weight of alkaline compounds and less than 5% by weight of boron.

9. A process according to claims 1, 2 or 3, wherein said whiskers contain excess carbon black which is removed by oxidation in air at between 500° and 700° C. for a period of from 1 to 10 hours.

10. A process according to claim 1, wherein said rate of rise in temperature is at most 3° C. min$^{-1}$ under a static atmosphere.

* * * * *